(12) United States Patent
Cole (10) Patent No.: US 7,860,400 B2
(45) Date of Patent: Dec. 28, 2010

(54) SERIALIZER/DESERIALIZERS FOR USE IN OPTOELECTRONIC DEVICES

(75) Inventor: Christopher R. Cole, Redwood City, CA (US)

(73) Assignee: Finisar Corporation, Sunnyvale, CA (US)

( * ) Notice: Subject to any disclaimer, the term of this patent is extended or adjusted under 35 U.S.C. 154(b) by 576 days.

(21) Appl. No.: 11/937,334

(22) Filed: Nov. 8, 2007

(65) Prior Publication Data

US 2008/0107422 A1    May 8, 2008

Related U.S. Application Data

(60) Provisional application No. 60/864,949, filed on Nov. 8, 2006, provisional application No. 60/892,177, filed on Feb. 28, 2007.

(51) Int. Cl.
*H04B 10/00* (2006.01)
*H04B 10/04* (2006.01)

(52) U.S. Cl. .................. 398/155; 398/154; 398/161; 398/192

(58) Field of Classification Search .......... 398/135, 398/136, 138, 155, 154, 161, 192, 163, 164
See application file for complete search history.

(56) References Cited

U.S. PATENT DOCUMENTS

| | | | |
|---|---|---|---|
| 6,628,679 B1 | 9/2003 | Talarek | |
| 7,088,767 B1 | 8/2006 | Cory | |
| 7,158,587 B2 | 1/2007 | Yang et al. | |
| 7,158,727 B2 * | 1/2007 | Pathak et al. | 398/155 |
| 7,161,961 B2 | 1/2007 | Barker et al. | |
| 7,165,863 B1 | 1/2007 | Thomas et al. | |
| 7,580,637 B2 * | 8/2009 | El-Ahmadi et al. | 398/135 |
| 2004/0136411 A1 | 7/2004 | Hornbuckle et al. | |
| 2005/0019036 A1 * | 1/2005 | Soto et al. | 398/135 |
| 2005/0062546 A1 | 3/2005 | Chung | |
| 2005/0163272 A1 * | 7/2005 | Payne et al. | 375/354 |

OTHER PUBLICATIONS

Sierra Monolithics, SMI4026 Sonet/OC-768 16 :1 Multiplexer/CMU, 2006 Sierra Monolithics, Inc., Redondo Beach, CA.
Sierra Monolithics, SMI4036 Sonet/OC-768 1 :16 CDR/Demultiplexer, 2006 Sierra Monolithics, Inc., Redondo Beach, CA.

* cited by examiner

*Primary Examiner*—Dalzid Singh
(74) *Attorney, Agent, or Firm*—Workman Nydegger (57) ABSTRACT

An optoelectronic device implements a serializer array circuit or multi-channel CDR circuit to reduce the cost and size of the circuit. An efficient serializer array circuit includes a plurality of serializer blocks sharing the functionality of a single CMU to clock a plurality of serial signals out of the final stages of the serializer blocks. An efficient multi-channel CDR circuit includes a single CDR for acquiring the clock for one of a plurality of data signals and a plurality of DLLs using the recovered clock to acquire the data for the plurality of data signals. Alternately, an efficient multi-channel CDR circuit includes a single frequency acquisition loop and a plurality of data acquisition loops.

18 Claims, 6 Drawing Sheets

SERIALIZER/DESERIALIZERS FOR USE IN OPTOELECTRONIC DEVICES

CROSS-REFERENCE TO RELATED APPLICATIONS

This application claims the benefit of U.S. Provisional Patent Application Ser. No. 60/864,949 entitled 100G MULTIPLEXED OPTICAL COMMUNICATION, filed Nov. 8, 2006 and U.S. Provisional Patent Application Ser. No. 60/892,177 entitled SERIALIZER/DESERIALIZERS FOR USE IN OPTOELECTRONIC DEVICES, filed Feb. 28, 2007, which are herein incorporated by reference.

BACKGROUND OF THE INVENTION

1. The Field of the Invention

The present invention relates generally to systems and devices for high speed data transmission. More particularly, embodiments of the present invention concern systems and devices having shared functionality to efficiently process multiple data signals from a host such as a MAC device, framer or FEC processor.

2. The Relevant Technology

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (referred to as an electro-optical transducer), such as a laser or Light Emitting Diode (LED). The electro-optical transducer emits light when current is passed through it, the intensity of the emitted light being a function of the current magnitude. Data reception is generally implemented by way of an optical receiver (referred to as an opto-electrical transducer), an example of which is a photodiode. The opto-electrical transducer receives light and generates a current, the magnitude of the generated current being a function of the intensity of the received light. The electro-optical transducer and the opto-electrical transducer are often integrated into a single optoelectronic device, such as an optical transceiver.

Many optoelectronic device architectures use a higher signaling rate to send optical signals over an optical fiber than to receive electrical signals from a line card on which they are used. This requires the device to convert from the higher optical data rate to the lower electrical data rate, and vice versa. Examples of such devices are those that comply with the 300-pin MSA or XENPAK form factor standard. The IC component that performs this function is called a serializer/deserializer, also commonly referred to as a SerDes.

The serializer portion of the SerDes receives two or more parallel data signals from a line card at a first signal rate and provides as output one or more serial data signals at a second signal rate. The number of output serial data signals is usually less than the number of input parallel data signals, although the same amount of data is conveyed by the output serial data signals. Consequently, the signal rate of one of the parallel data signals is less than the signal rate of one of the serial data signals. To accomplish this conversion, the serializer contains a clock and data recovery ("CDR") and/or delay lock loop ("DLL") function on each input data lane to receive the data from the line card. The serializer frequently contains a clock multiplier unit ("CMU") to synthesize the high rate clock required for the serial data signal rate and a multiplexer with ratio M:1, corresponding to M input parallel data lanes that are multiplexed onto one output serial signal. Note that when the serializer serializes M input parallel data signals onto one output serial data signal, the parallel data signal rate is 1/M of the serial data signal rate. Of course, the M input parallel data lanes may also be multiplexed onto X output serial data lanes, where X is less than M, in which case the parallel data signal rate is X/M of the serial data signal rate. As used herein, "single-channel serializer" may be used to refer to a serializer that multiplexes multiple signals into a single signal and "multi-channel serializer" may be used to refer to a serializer that multiplexes multiple signals into a fewer number of signals not less than two signals.

The deserializer portion of the SerDes performs a function that is the reverse of the function performed by the serializer. It has an input CDR that recovers the serial data stream clock, and can have an input flip-flop into which the serial data is clocked into. There is then a 1:M (or X:M) demultiplexer which demultiplexes the single (or X) serial data stream(s) into M electrical data streams. A "single-channel deserializer" refers to a deserializer that demultiplexes a single input signal into multiple signals and usually has a single CDR, while a "multi-channel deserializer" refers to a deserializer that demultiplexes multiple input signals into a greater number of signals and usually has a plurality of CDRs, the number of CDRs corresponding to the number of input signals. Note that the designations "single-channel" and "multi-channel" may also be applied to a SerDes when the SerDes can convert between multiple signals and a single signal or multiple signals and a fewer number of signals, respectively.

Other optoelectronic device architectures use the same signaling rate to send optical signals over an optical fiber and to receive electrical signals from a line card, and as a result do not require a SerDes to convert between a high optical data rate and a low electrical data rate. For example, the XFI interface standard is used with the XFP form factor standard. It has a single 10 G electrical data stream which is mapped to a single 10 G optical data stream. Such devices can be implemented with a single CDR in the electrical to optical direction and a single CDR in the optical to electrical direction.

As demands for higher data transmission speeds between points in optical networks have increased, single-channel and multi-channel device architectures have been proposed and/or developed which include one higher-speed optical channel or multiple lower-speed optical channels having a relatively high aggregate speed. When the optical per channel data rate is different than the electrical per channel data rate, these device architectures require either a multi-channel or single-channel SerDes depending on the number of optical channels and other factors. Additionally, multi-channel device architectures may require multiple SerDes, whether single-channel or multi-channel. When the optical per channel data rate is the same as the electrical per channel data rate, these device architectures require either a multi-channel or single-channel CDR function, also depending on the number of optical channels. As used herein, a multi-channel CDR or CDR function refers to a CDR which can recover the clock and data for a plurality of data channels and provide the same number of recovered data channels. In contrast, a single-channel CDR or CDR function refers to a CDR which can recover the clock and data for a single data channel and provide a single recovered data channel.

The conventional approach to implementing multiple serializers, whether single-channel or multi-channel, would be to replicate the standard serializer architecture described above N times (e.g., once for every one of N optical channels), and would cost N times the silicon area. Similarly, the conventional approach to implementing a multi-channel CDR would be to replicate the standard CDR architecture N times and would cost N times the silicon area.

BRIEF SUMMARY OF THE INVENTION

Embodiments of the present invention are directed to systems and devices for high speed data transmission. In particular, embodiments of the invention enable the use of serializer arrays or multi-channel CDRs having shared functionality. In this manner, the size and cost of integrated circuits containing the serializer arrays and/or multi-channel CDRs is reduced.

According to one embodiment of the invention, an efficient serializer array includes two or more serializer blocks. Each serializer block includes an input stage to receive and recover parallel data signals from a host, a FIFO array for receiving the recovered data signals and a multiplexer for serializing the parallel recovered data signals into one or more serial data signals. A single CMU receives a reference clock and uses it to synthesize a higher rate clock signal used for the one or more serial data signals. The functionality of the single CMU is shared by each of the serializer blocks by providing the higher rate clock signal to the serializer blocks.

According to another embodiment of the invention, a multi-channel CDR includes two or more CDR blocks, each CDR block including a data acquisition loop. One of the CDR blocks additionally includes a frequency acquisition loop. The frequency acquisition loop utilizes a reference clock to lock onto the frequency of an incoming data signal. Once frequency lock is achieved, the data acquisition blocks acquire the data from each of the input data signals.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the drawings to describe various aspects of exemplary embodiments of the invention. It should be understood that the drawings are diagrammatic and schematic representations of such exemplary embodiments and, accordingly, are not limiting of the scope of the present invention, nor are the drawings necessarily drawn to scale.

The present invention can be implemented in various system architectures in which data is transmitted and received through an optoelectronic device. As used herein, the term "optoelectronic device" includes devices having both optical and electrical components. Examples of optoelectronic devices include, but are not limited to transponders, transceivers, transmitters, and/or receivers. The invention relates to efficient optoelectronic devices, components of which share functionality to process multiple electrical data channels. The optoelectronic devices can exemplarily be used in telecommunications networks, local area networks, metro area networks, storage area networks, wide area networks, and the like. The principles of the present invention may be implemented in optoelectronic devices of any form factor currently available or that may be developed in the future for 40 G, 50 G or 100 G signaling, without restriction. It will be appreciated, however, that the optoelectronic devices need not comply with standardized form factor requirements and may have any size or configuration necessary according to a particular design.

I. Exemplary Operating Environments

Figure 1:
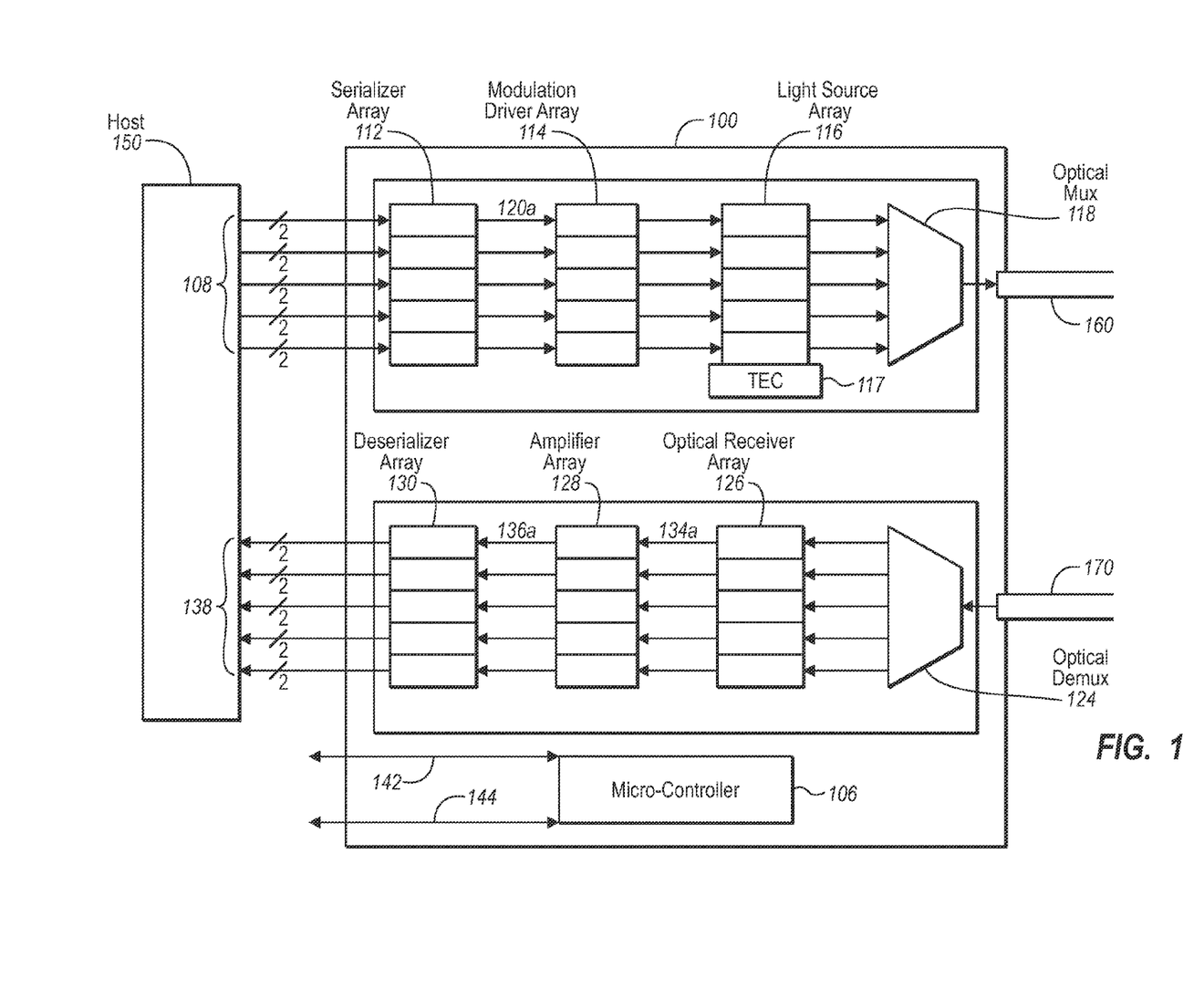
FIG. 1 depicts an exemplary transceiver module in which embodiments of the invention may be practiced.

FIG. 1 illustrates an exemplary multi-channel optical transceiver 100 in which principles of the invention may be employed, further depicting the interaction between the device 100, a host 150 and fiber optic cables 160, 170. While the optical transceiver 100 will be described in some detail, the optical transceiver 100 is described by way of illustration only, and not by way of restricting the scope of the invention. In particular, some of the components used to facilitate one type of multi-channel transmission technique may or may not be necessary in another type of multi-channel transmission technique. For instance, in the present embodiment, the multi-channel optical transceiver 100 implements wavelength division multiplexing (WDM) to transmit and receive multiple data channels over single mode optical fiber (SMF) 160, 170, requiring an optical multiplexer (MUX) for transmission and an optical demultiplexer (DEMUX) for reception of optical signals. However, the invention may also be utilized in multi-channel transceivers implementing other multi-channel transmission techniques, such as parallel optics and quadrature multiplexing, including differential quadrature phase shift keying (DQPSK). Additionally, the invention may be implemented in single-channel transceivers. Thus, the fiber optic cables 160, 170 may comprise SMF, multimode optical fibers (MMF), parallel ribbon fibers, and the like.

During operation, the module 100 can receive a ten-channel parallel electrical data stream 108 from a host device 150 such as a media access controller ("MAC") card or framer for transmission as five data carrying optical signals onto the SMF 160. The ten electrical signals are provided to five transmit channels (two electrical signals per channel) for emission as five optical signals, each transmit channel including a serializer, a driver and an electro-optical transducer. In greater detail, the ten electrical signals are provided to five serializer blocks 112, each serializer block serializing a set of two electrical signals into one output electrical signal. Of course, each serializer 112 can be a single-channel or multi-channel serializer, receiving any number of input electrical signals and outputting one or more serialized signals. Hence, the present invention should not be limited to single-channel serializers which serialize two electrical signals into one electrical signal.

After the ten electrical signals have been serialized into five electrical signals, the five electrical signals are provided to five modulation drivers 114, which drive five electro-optical transducers 116 to emit five optical signals representative of the information carried in the five electrical signals. Each of the five electro-optical transducers comprises a light source having any suitable configuration, including, but not limited to, a distributed feedback laser ("DFB"), a vertical cavity surface emitting laser ("VCSEL"), a cooled or uncooled externally modulated laser ("EML"), an EML with a wave-locker, a Fabry-Perot laser, a light emitting diode ("LED"), and the like. In the present embodiment, the five electro-optical transducers 116 comprise an array of five EMLs fabricated as a single semiconductor component, although other arrangements, light sources and materials may also be used.

A thermoelectric cooler ("TEC") 117 may be coupled to the electro-optical transducers 116 in order to stabilize the wavelength emission of and absorb the power dissipated by each transducer.

Because the present embodiment implements WDM, the five optical signals emitted by the transducers 116 each occupy a distinct wavelength channel. In one embodiment, the wavelengths may be chosen from the 200 gigahertz (or "GHz") dense wavelength division multiplexing (DWDM) grid specified by Recommendation G.694.1 of the International Telecommunication Union Telecommunication Standardization Sector ("ITU-T"), and the transducers 116 are configured to produce optical signals at the chosen wavelengths. The electro-optical transducers 116 are coupled to a DWDM MUX 118 and the five optical signals emitted by the transducers 116 are optically multiplexed and transmitted over a single physical link, namely the SMF 160. Those skilled in the art will recognize that other configurations may be implemented. For instance, the electro-optical transducers may comprise an array of cooled or un-cooled DMLs configured to emit optical signals chosen from the 20 nanometer (or "nm") coarse WDM ("CWDM") grid specified by ITU-T G.694.2. In this case, the DML array is coupled to a CWDM MUX and the optical channels are multiplexed and transmitted over a single SMF or MMF.

The multi-channel transceiver 100 is also configured to receive optically multiplexed signals from the SMF 170. A received optically multiplexed signal passes through an optical DEMUX 124 which performs the inverse of the MUX 118. In the present embodiment, the DEMUX comprises a 1:5 DEMUX, which means a multiplexed optical signal passing through the DEMUX 124 is separated into five individual optical signals, each of the five signals occupying a distinct wavelength channel. The five optical signals are provided to five receive channels, each receive channel including an opto-electrical transducer, a post-amplifier and a deserializer.

In greater detail, the five optical signals received from the DEMUX 124 are provided to five opto-electrical transducers 126, which transform the optical signals into electrical signals. Each of the opto-electrical transducers 126 comprises a photodetector such as a photodiode, an avalanche photodiode (APD), a positive-intrinsic-negative photodiode (PIN), and the like. In the present embodiment, the five opto-electrical transducers 126 comprise an array of five PINs fabricated on a single piece of Indium Phosphide, although other arrangements, transducers and materials may also be used.

The five electrical signals produced by the opto-electrical transducers 126 are provided to five post-amplifiers 128 which amplify each electrical signal. The post-amplifiers 128 may comprise an array of transimpedance amplifiers ("TIAs"), although other types of amplifiers may also be used. The amplified electrical signals are provided to five deserializer circuits 130. Each of the deserializers 130 may extract an embedded clock from the amplified electrical signals using a CDR and deserialize each electrical signal into two or more parallel electrical signals. The resulting ten electrical signals are provided to the host 150. Those skilled in the art will recognize that each of the five deserializers 130 can be a single-channel or a multi-channel deserializer depending on the number of input signals per deserializer. Hence, the present invention should not be limited to single-channel deserializers which deserialize one electrical signal into two electrical signals.

Finally, the module 100 may also include a micro-controller 106. The micro-controller 106 may be used in a number of ways, including optimizing the dynamically varying performance of the transceiver 100 by, for instance, adjusting settings on each of the drivers 114 and/or post-amplifiers 128. Various interfaces, such as an I²C interface 142 and hardware I/O 144 may permit the micro-controller to communicate directly with a host and/or hardware components within the transceiver 100.

Figure 2:
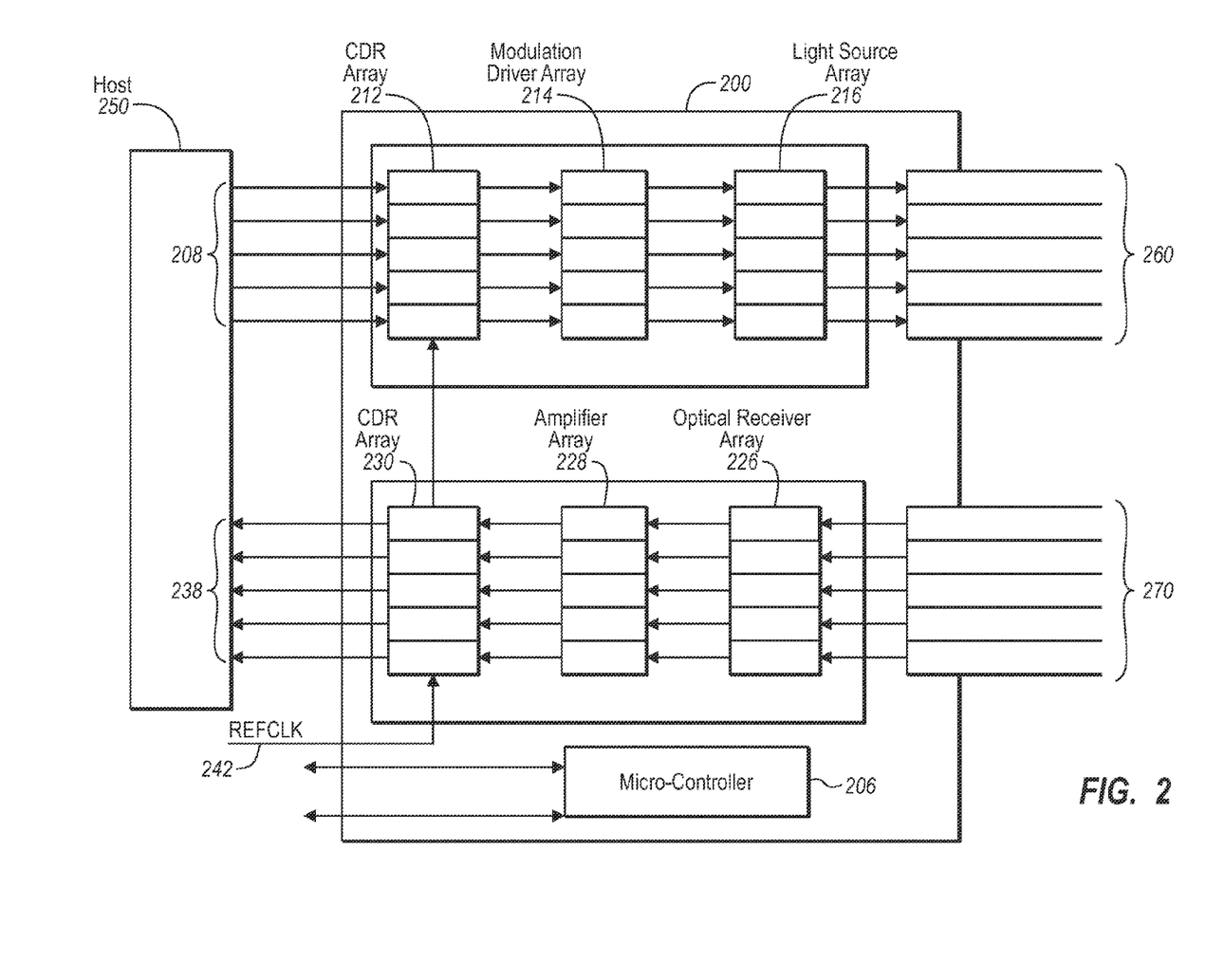
FIG. 2 depicts a second exemplary transceiver module in which embodiments of the invention may be practiced.

FIG. 2 illustrates a second exemplary multi-channel optical transceiver 200 in which principles of the invention may be employed, further depicting the interaction between the device 200, a host 250 and parallel ribbon fibers 260, 270. The optical transceiver 200 is described by way of illustration only, and not by way of restricting the scope of the invention. The distinguishing feature between this implementation and the implementation of FIG. 1 relates to the ratio of the electrical signal rate between the module 200 and the host to the optical signal rate. In FIG. 1, the electrical signal rate between the host and the module is less than the optical signal rate to and from the optical fibers, in particular a ratio of 1:2. By way of comparison, the ratio of the electrical signal rate between the host and the module to the optical signal rate in the implementation of FIG. 2 is always 1:1. Thus, even though FIG. 2 depicts a transceiver implementing parallel optics, the principles of the invention are equally applicable in a transceiver implementing wavelength division multiplexing (WDM)—dense or coarse—and quadrature multiplexing where the ratio of the electrical signal rate to optical signal rate is 1:1.

During operation, the module 200 can receive five electrical signals 208 from a host 250 for transmission as five data carrying optical signals onto the SMF 260. The five electrical signals are provided to five transmit channels for emission as five optical signals, each transmit channel comprising a clock and data recovery ("CDR") block, a driver and an electro-optical transducer. The CDR blocks 212 receive the five electrical signals and may use a common reference clock signal (REFCLK) 242 to frequency lock the received signals during clock and data recovery. After the CDR blocks 212 have recovered the data and clock from the five input electrical signals 208, the five electrical signals are provided to five modulation drivers 214 which drive five electro-optical transducers 216 to emit five optical signals representative of the information carried in the five electrical signals. According to the present embodiment of the invention, the electro-optical transducers 216 comprise an array of VCSELs, although other electro-optical transducers may be used as may be best suited for a particular application.

In the present embodiment, the electro-optical transducers 216 may each emit optical signals at the same wavelength— e.g., ~850 nm for VCSELs. The optical signals are then transmitted over separate optical fibers 260. Because only one optical signal is transmitted over each fiber, there is no need to include an optical MUX in the transceiver 200.

Five optical signals may also be received by the module 200 and provided to five receive channels, each receive channel comprising an opto-electrical transducer, a post-amplifier and a CDR block. The operation of the opto-electrical transducers 226 and post-amplifiers 228 is similar to the operation of the opto-electrical transducers 126 and post-amplifiers 128 of FIG. 1 and will not be described in detail. Five amplified electrical signals representative of the five received optical signals are provided to the CDR blocks 230. The CDR blocks 230 may sample the data of the amplified signals and quantize it in time and amplitude, recovering the clock and data signals using the REFCLK signal 242. Recovered electrical output data signals 238 are provided to the host 250.

Similar to the transceiver 100 of FIG. 1, the transceiver 200 of FIG. 2 may additionally include a micro-controller 206 for optimizing the dynamically varying performance of the module 200 and communicating with the host 250 and/or hardware components within the transceiver 200.

II. Exemplary Efficient SerDes Array

Figure 3:
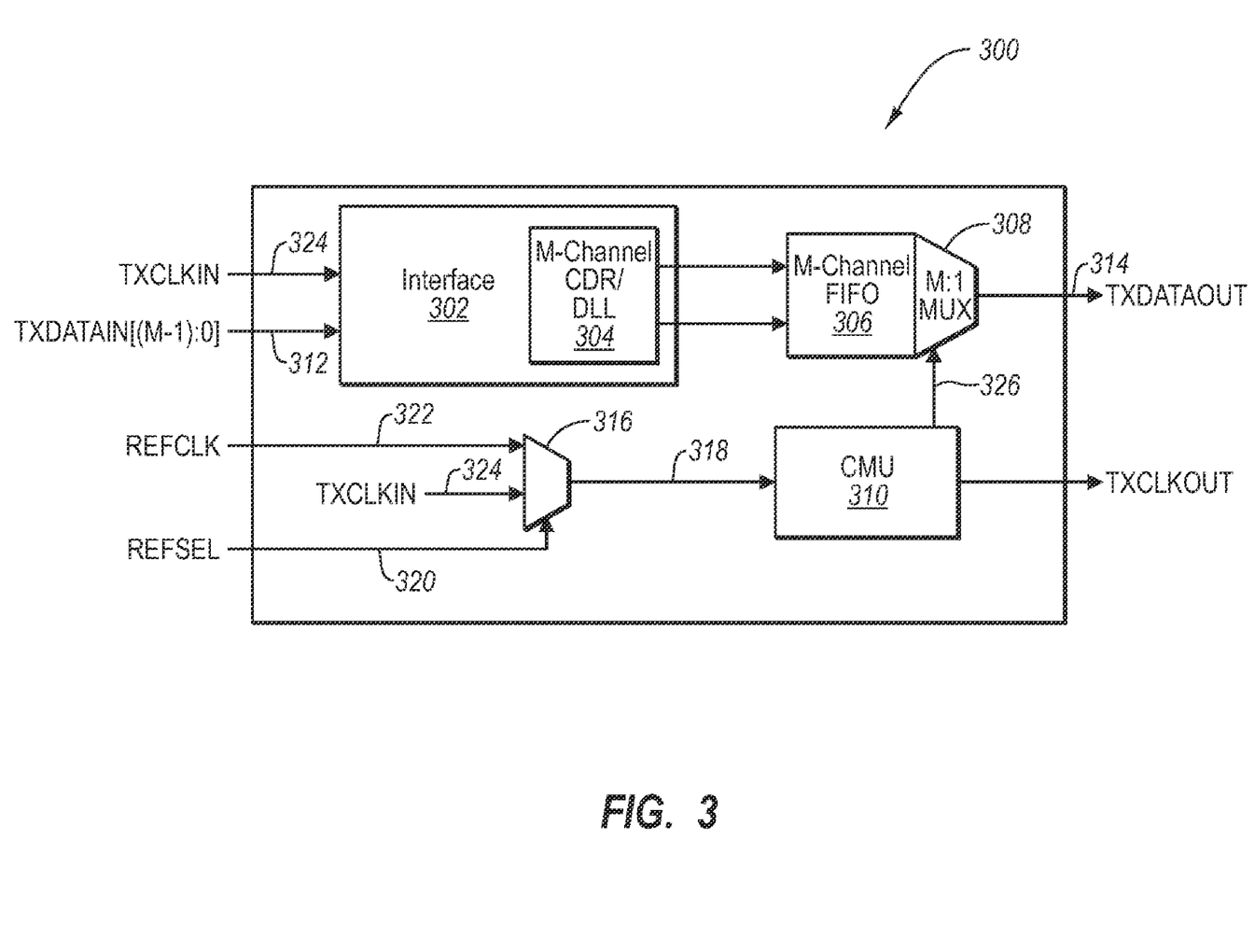
FIG. 3 illustrates a single-channel serializer.

With reference to FIG. 3, one embodiment of a simplified single-channel serializer 300 is depicted. The serializer may be used in an optical transceiver when the optical signaling rate is higher than the electrical signaling rate of the system, as in the embodiment of FIG. 1. The serializer may convert lower speed parallel electrical signals into higher speed serial electrical signals by combining multiple electrical signals into fewer signals at a faster clock rate. The serializer 300 may comprise various components, including an optional interface unit 302, a multi-channel input stage 304 such as a CDR and/or delay locked loop (DLL) array, a multi-channel FIFO array 306, an M:1 multiplexer 308 and a clock multiplier unit (CMU) 310.

The serializer 300 receives a plurality of parallel data signals TXDATAIN 312 and supplies high speed serial data TXDATAOUT 314. For purposes of discussion, let the number of received parallel data signals be represented by "M". The serial data is supplied to a driver and light source (not shown) which converts the serial electrical data into optical data. Those of skill in the art will recognize that the parallel and serial data signals may be implemented as differential signals or single-ended signals.

The serializer 300 incorporates a selector circuit (such as a multiplexer) 316, which selects the source for a reference clock 318 supplied to the CMU 310 according to a reference clock select signal 320 (REFSEL), supplied on an input terminal of the integrated circuit 300. The clocks that are selectable in the illustrated embodiment include a fixed reference clock 322 (REFCLK) and TXCLKIN 324, which is also used to clock data into the FIFO 306. Use of the FIFO clock 324 as the CMU reference clock allows a simpler design of the serializer 300 in that a separate reference clock no longer needs to be supplied.

Accordingly, low-speed parallel data signals 312 and a low speed clock 324 are received by a suitable interface circuit 302. For instance, a suitable data and clock input interface 302 may be compliant with the SFI-4.1 interface standard, which specifies conversion of 16 electrical data lanes, each at approximately 622 MHz to approximately 10 G data rate, and vice versa. Alternately, the interface 302 may comply with the SFI-5.1 standard, which specifies conversion of 16 electrical data lanes, each at approximately 2.5 GHz to approximately 40 G data rate, and vice versa. Other suitable interfaces 302 may exist according to a particular embodiment and the invention should not be limited to the standards explicitly stated. Typically, the interface unit 302 is included when performing decoding of the incoming parallel electrical signals, as required by the SFI-4.1, SFI-5.1 and other interface standards. Hence, an interface unit 302 is not necessary in all implementations, such as when the decoding is performed by a host.

The data clock and M data channels may be recovered using per-channel dedicated CDR's 304 employing delay lock loop (DLL) or voltage controlled oscillator (VCO)-based implementations. The reconstructed data and clock channels from the DLLs may be clocked into the FIFO array 306. The CMU 310 supplies a clock signal 326 which is used to read data out of the FIFO 306. In the illustrated embodiment, an M:1 multiplexer is used to select the bit of the M bit word written into the FIFO for serial output on TXDATAOUT 314. The CMU multiplies the frequency of the selected reference clock up to the serial transmit data rate. While FIG. 3 illustrates a single-channel serializer, one skilled in the art will recognize that a multi-channel serializer can be implemented with similar components as in FIG. 3 by substituting an M:X multiplexer for the M:1 multiplexer 308 of FIG. 3, where X represents the number of output signals, X being less than M and greater than 1.

Figure 4:
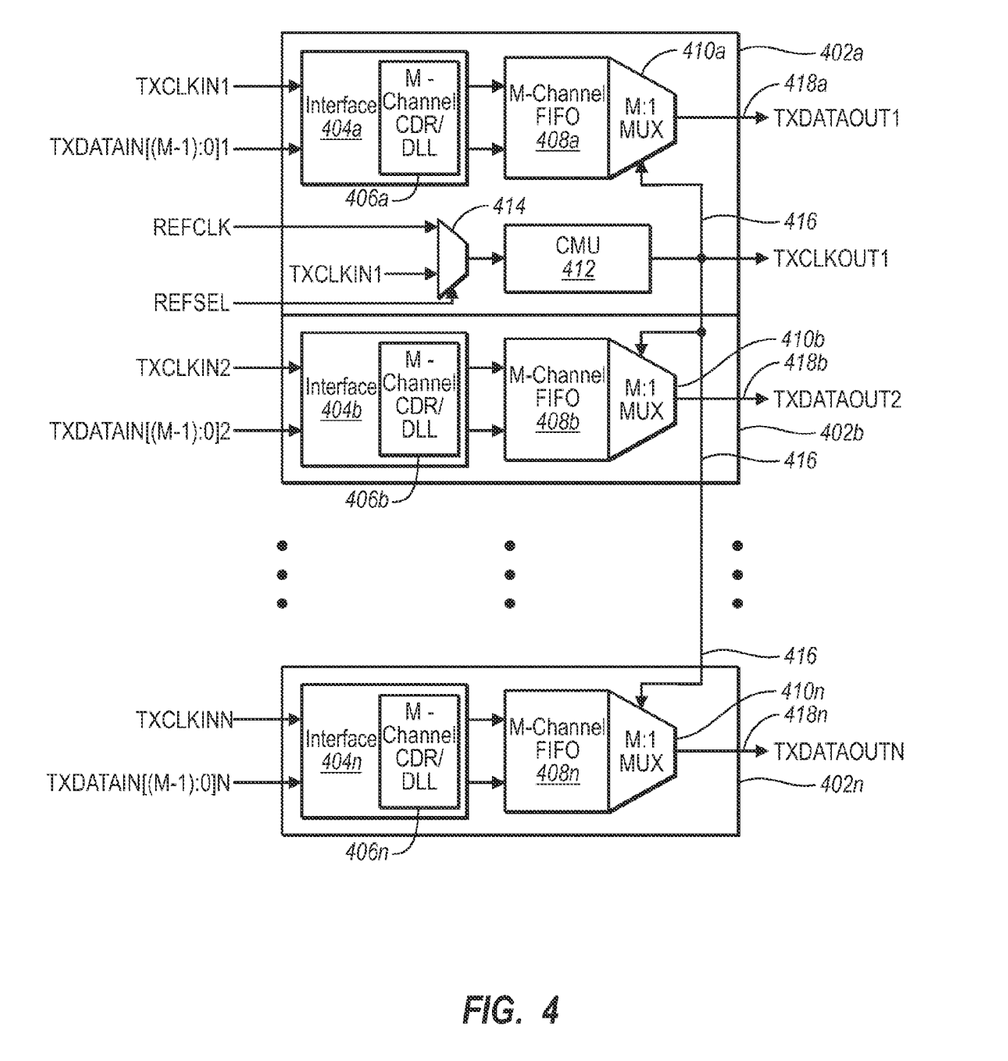
FIG. 4 illustrates a multi-channel serializer according to one embodiment of the invention.

With regard now to FIG. 4, one embodiment of the invention is described in conjunction with FIGS. 1 and 3. FIG. 4 illustrates an efficient serializer array circuit 400 which may be implemented in the multi-channel transponder 100 of FIG. 1. The circuit 400 may correspond to the serializer array 112 of FIG. 1, and has N single-channel serializer blocks (402a and 402b up to 402n), each of which can accept M parallel signals and output one serialized signal. In other embodiments, however, each serializer block 402a-402n may comprise a multi-channel serializer. In the configuration shown, the circuit 400 has N serial output channels and M×N parallel input channels. The multi-channel serializer 400 circuit may be implemented in high speed optical networks to serialize M×N parallel electrical channels into N electrical channels and ultimately N optical channels.

The conventional approach for implementing a serializer array having equivalent functionality replicates the standard serializer architecture described in FIG. 3 N times, and costs N times in silicon area. However, the embodiment of FIG. 4 advantageously reduces the amount of silicon area needed to implement an N-array serializer (e.g., a serializer array having N serializers).

In the embodiment of FIG. 4, one serializer block 402a includes a standard serializer architecture such as illustrated in FIG. 3. Namely, block 402a includes an optional interface circuit 404a, an M-channel input stage 406a, such as an M-channel CDR and/or DLL array, an M-channel FIFO array 408a, an M:1 multiplexer 410a (which could alternately be an M:X multiplexer in a multi-channel serializer), a CMU 412 and a selector circuit 414. However, the remaining blocks 402b up to 402n do not replicate the standard serializer architecture. Rather, blocks 402a-402n share the functionality of the clock multiplier unit 412 and the selector circuit 414, thereby reducing the required silicon area for the serializer array circuit 400 by (N−1) CMUs. Thus, block 402b comprises an optional interface circuit 404b, an input stage 406b, an M-channel FIFO array 408b and an M:1 multiplexer 410b.

Similarly, block 402n comprises an optional interface circuit 404n, an input stage 406n, an M-channel FIFO array 408n and an M:1 multiplexer 410n.

In operation, each block 402a-n receives a low-speed clock and M input electrical signals at an interface circuit 404a-n, respectively. In the event that any data encoding or decoding is performed by a host, each serializer block may receive a low speed clock and M input electrical signals using dedicated CDR's 406a-n without the need for an interface circuit. Each block 402a-402n recovers a clock and M data signals at the input stages 406a-406n using, for example, per signal dedicated CDR's, respectively, employing DLL or VCO-based implementations. The recovered clock and data signals from the DLLs may be clocked into the FIFO arrays 408a-n, respectively. The CMU 412 supplies a multiplied clock signal 416 to the FIFO arrays 408a-n which is used to read data out of the FIFOs. M:1 multiplexers 410a-n in each of the N blocks each combine M parallel signals into a single serialized channel, providing as output to the driver and light source arrays N serial channels 418a and 418b up to 418n. In an alternate embodiment, an M:X multiplexer in each of N multi-channel serializers 402a-402n combines M parallel signals into X serial signals.

III. Exemplary Efficient Multi-Channel CDR

Figure 5A:
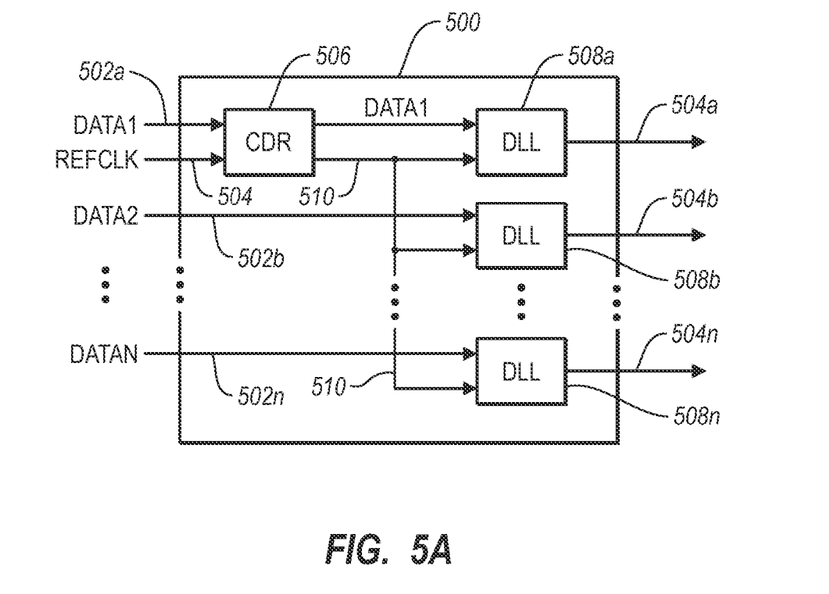
FIGS. 5A and 5B illustrate multi-channel CDRs according to embodiments of the invention.
Figure 5B:
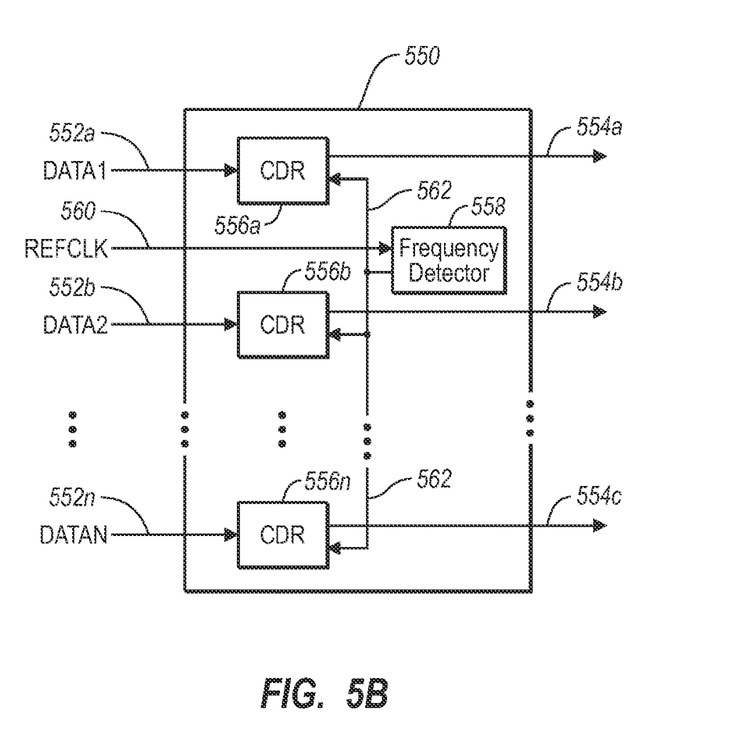

With reference now to FIGS. 5A and 5B, two embodiments of an efficient multi-channel clock and data recovery ("CDR") circuit 500 and 550 are illustrated. The efficient multi-channel CDR circuits 500 and 550 can be implemented, for example, in either the electrical-to-optical or optical-to-electrical directions of a multi-channel transceiver in which the ratio of the electrical signal rate to optical signal rate is 1:1. For instance, the circuits 500 or 550 can correspond to the EO-CDR array 212 or the OE-CDR array 230 of FIG. 2. Additionally, the circuits 500 or 550 can be implemented in a multi-channel deserializer to recover the clock and data on multiple data signals before separating the multiple data signals into a greater number of data signals with a demultiplexer.

According to the embodiment of FIG. 5A, the circuit 500 can receive N electrical input signals including DATA1 502a and DATA2 502b amongst potentially others as represented by DATAN 502n. The circuit 500 recovers the clock and data for the N data signals 502a to 502n and provides N recovered signals 504a, 504b and 504n to: (1) N drivers in the case of an EO CDR circuit; (2) a host in the case of an OE CDR circuit; and (3) a demultiplexer in the case of a multi-channel deserializer. The signal rate of the input signals 502a, 502b and 502n is the same as the signal rate of the output signals 504a, 504b and 504n.

The conventional approach to recovering the clock and data for N input electrical data signals would replicate a traditional CDR structure N times and would cost N times the silicon area. According to the present embodiment, however, the frequency detecting function of a single CDR 506 is shared by N delay locked loops (DLLs) 508a and 508b up to 508n, thereby reducing the cost and silicon area required to implement a multi-channel CDR circuit.

In particular, a single CDR 506 (or CMU with a 1:1 clock multiplication ratio) uses a fixed clock reference 504 to recover a clock signal for an input data signal 502a. Alternately, the CDR 506 could use the input data signal 502a as its clock input. The recovered clock 510 is provided to DLL 508a. In addition, the recovered clock 510 is provided to DLL 508b and any other DLLs 508n. Each DLL 508a, 508b up to 508n uses the recovered clock 510 to recover data from the N input signals 502a and 502b up to 502n. Advantageously, N DLLs are more efficient to implement than N CDRs would be because each DLL only has to acquire the phase of the incoming signal whereas each CDR would have to acquire both the phase and the frequency of the incoming signal.

FIG. 5B illustrates another embodiment for reducing the cost and silicon area required to implement a multi-channel CDR circuit. Just as with the circuit 500 of FIG. 5A, the circuit 550 can receive N electrical input signals including DATA1 552A and DATA2 552b amongst potentially others as represented by DATAN 502n, recover the clock and data for the N data signals and provide N recovered signals 554a, 554b and 554n to N drivers or a host system. In contrast to the circuit 500 of FIG. 5A, the efficient multi-channel CDR circuit 550 of FIG. 5B includes N CDRs 556a, 556b and 556n rather than a single CDR. However, a single frequency lock detector 558 is shared by the N CDRs 556a, 556b and 556n, thereby reducing the cost and silicon area required to implement the multi-channel CDR circuit 550.

According to the embodiment of FIG. 5B, the frequency detector 558 receives a reference clock signal REFCLK 560 and uses it to recover a clock signal for each of the input signals 552a, 552b and 552n. The recovered clock signal 562 is provided to each of the CDRs 556a, 556b and 556n to recover the data from the input signals 552a, 552b and 552n. In one embodiment, an input multiplexer in the frequency detector 558 cycles through each of the individual signals from the CDRs 556a-556n to sequentially perform the frequency detection function. The recovered data signals 554a, 554b and 554n may then be provided to N drivers, a host or a demultiplexer for subsequent processing, depending on whether the multi-channel CDR circuit 550 is an EO CDR circuit, an OE CDR circuit or implemented in a multi-channel deserializer.

Figure 6:
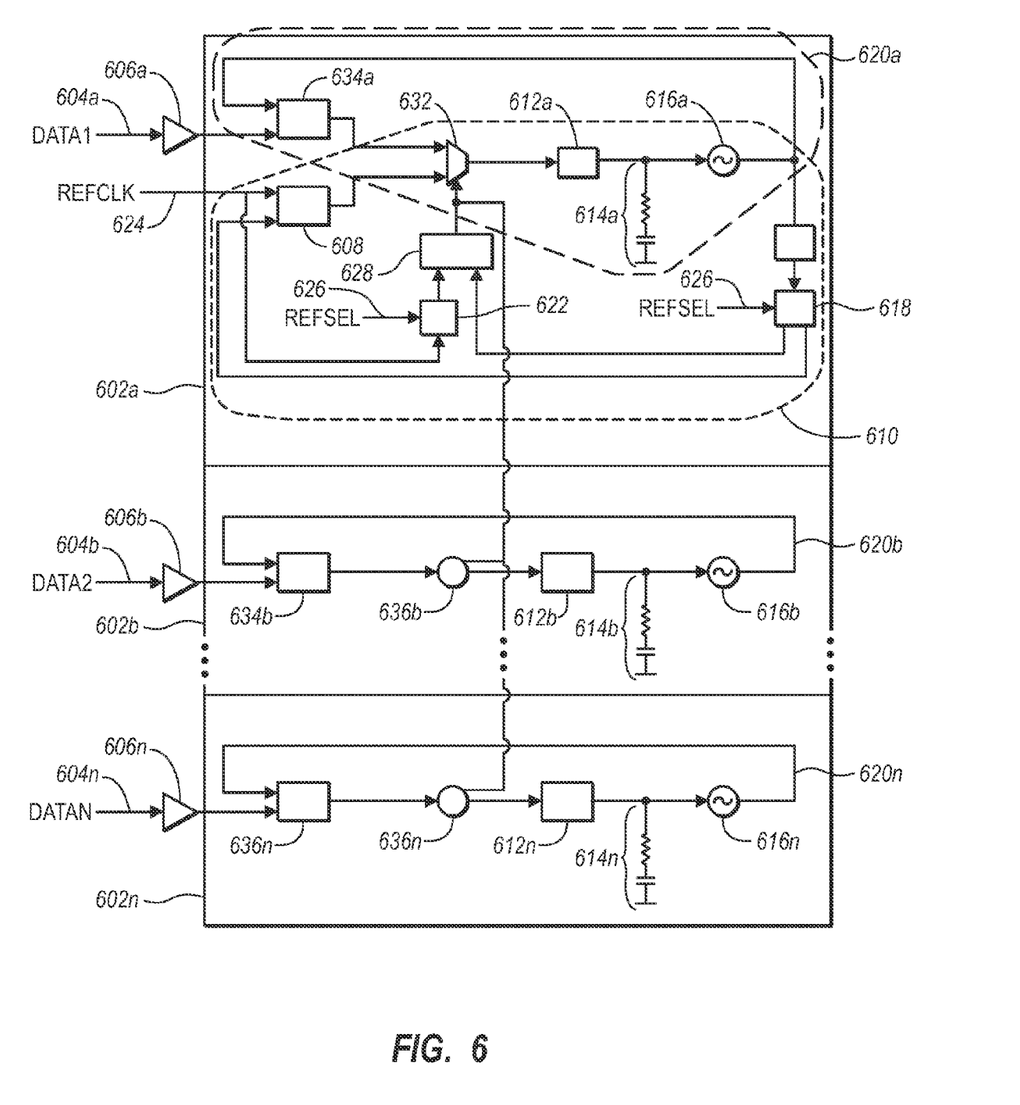
FIG. 6 depicts an embodiment of the multi-channel CDR of FIG. 5B in greater detail.

FIG. 6 illustrates in more detail one embodiment of a multi-channel CDR circuit 600 having a single frequency lock detector shared across all data lanes, such as the circuit 550 described with respect to FIG. 5B. The circuit 600 includes multiple CDRs 602a and 602b amongst potentially others as illustrated by block 602n. Each CDR includes a data acquisition loop and can receive an input data signal 604a, 604b or 604n from data buffers 606a, 606b or 606n and recover the data therefrom.

In the present embodiment, the first CDR 602a has a dual-loop architecture and, in addition to the data acquisition loop 620a, includes a frequency acquisition loop or frequency lock detector 610 which is shared by all the CDRs 602a, 602b and 602n. The frequency acquisition loop 610 consists of a phase-frequency detector ("PFD") 608, a charge pump 612a, a loop filter 614a, a voltage controlled oscillator ("VCO") 616a and programmable dividers 618 and 622. The frequency acquisition loop 610 is used to lock the VCO frequency to an incoming reference-clock frequency ("REFCLK") 624, which may be selectable between a variety of frequencies. A REFSEL signal 626 configures the dividers 618 and 622 so that a proper comparison can be made for a given reference clock frequency. A counter-based frequency comparator 628 monitors the reference-clock frequency and the divided down VCO frequency, generating a signal indicating a frequency-locked condition when the VCO 616a is within, for instance, 1500 ppm of the reference clock 624. A multiplexer 632 preceding the charge pump 612a then switches to the data-acquisition loop 620a.

The data-acquisition loop 620a includes a bang-bang phase detector 634a, the charge pump 612a, loop filter 614a and VCO 616a. The charge pump 612a, loop filter 614a and VCO 616a are shared between the frequency-acquisition and data-acquisition loops 610 and 620a. The data-acquisition loop 620a drives the remaining frequency error to zero and aligns the phase of the VCO 616 for optimal sampling.

The CDRs 602b and 602n also include data acquisition loops 620b and 620n, although they do not have a frequency lock detector or frequency acquisition loop. In particular, CDR 602b includes a bang-bang phase detector 634b, charge pump 612b, loop filter 614b and VCO 616b. Similarly, CDR 602n includes a bang-bang phase detector 634n, charge pump 612n, loop filter 614n and VCO 616n. In addition to being provided to the multiplexer 632, the signal generated by the frequency comparator 628 indicating a frequency-locked condition is also provided to switches 636b and 636n which switch on the data acquisition loops 620b and 620n of CDRs 602b and 602n. In this manner, one frequency acquisition loop or frequency lock detector can be shared across all the incoming data lanes, thereby reducing the cost and size of a multi-channel CDR circuit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A serializer array having shared functionality, the serializer array comprising:
    a plurality of serializer blocks, each serializer block capable of receiving a plurality of parallel data channels and including:
        an input stage for recovering a clock signal and data from each of the plurality of parallel data channels received by a serializer block and providing a plurality of recovered parallel data channels as output;
        a first in first out array coupled to the input stage into which the plurality of recovered parallel data channels may be clocked; and
        a multiplexer coupled to the first in first out array for serializing the plurality of recovered parallel data channels; and
    a single clock multiplier unit for receiving a reference clock signal and supplying a multiplied clock signal to the first in first out array of each of the plurality of serializer blocks, the multiplied clock signal being used to read data out of the first in first out array of each serializer block at a data rate which is faster than a data rate of the received parallel data channels.

2. The serializer array of claim 1, wherein each of the input stages includes one or more of:
    a plurality of clock and data recovery circuits;
    a plurality of delay lock loops; and
    a plurality of voltage controlled oscillators
for recovering the clock signal and data from each of the plurality of parallel data channels.

3. The serializer array of claim 1, further comprising a selector circuit for selecting a source for the reference clock signal received by the single clock multiplier unit.

4. The serializer array of claim 3, wherein the selector circuit includes a multiplexer.

5. The serializer array of claim 1, wherein each serializer block further includes an interface circuit for decoding the plurality of parallel data channels.

6. The serializer array of claim 1, wherein each serializer block comprises a single-channel serializer or a multi-channel serializer.

7. A multi-channel clock and data recovery circuit for processing a plurality of data signals, the circuit comprising:
    a plurality of clock and data recovery blocks for receiving a plurality of data signals, each clock and data recovery block receiving one data signal and recovering a clock signal and data for the received data signal, the plurality of clock and data recovery blocks sharing the functionality of a single frequency detecting block;
    the single frequency detecting block coupled to the plurality of clock and data recovery blocks, wherein the frequency detecting block acquires and locks to a frequency of a reference clock signal for each of the plurality of clock and data recovery blocks; and
    a counter-based frequency comparator, wherein the frequency comparator generates a signal indicating a frequency-locked condition when the frequency detecting block locks to the frequency of the reference clock signal and wherein the generated signal is provided to each of the clock and data recovery blocks.

8. The circuit of claim 7, wherein each of the plurality of clock and data recovery blocks includes:
    a phase detector;
    a charge pump;
    a loop filter; and
    a voltage controlled oscillator.

9. The circuit of claim 7, wherein the frequency detecting block includes:
    a phase-frequency detector;
    a charge pump;
    a loop filter;
    a voltage controlled oscillator; and
    one or more programmable dividers.

10. A multi-channel optoelectronic device for use in optical communication networks, comprising:
    a clock and data recovery array for receiving a plurality of data signals from a host, wherein the clock and data recovery array recovers data from the plurality of data signals and provides a plurality of recovered data signals as output, wherein the clock and data recovery array includes:
        a plurality of delay lock loops coupled to the frequency detecting block, wherein the frequency detecting block comprises a clock and data recovery block, each of the plurality of delay lock loops configured to:
            receive the clock signal recovered by the clock and data recovery block and receive one of the plurality of data signals;
            use the recovered clock signal to recover the data from the received data signal; and
            provide a recovered data signal as output;
        a frequency detecting block coupled with the clock and data recovery array that detects a frequency of the plurality of data signals and is shared throughout the clock and data recovery array;
    a driver array coupled to the clock and data recovery array for receiving the plurality of recovered data signals from the clock and data recovery array and providing a plurality of modulation signals as output; and
    an electro-optical transducer array coupled to the driver array for receiving the plurality of modulation signals from the driver array and emitting a plurality of optical signals representative of the plurality of recovered data signals.

11. The device of claim 10, wherein the clock and data recovery array includes a plurality of clock and data recovery blocks for receiving the plurality of data signals, each clock and data recovery block receiving one data signal and recovering a clock and data from the received data signal, and wherein the frequency detecting block acquires and locks to a frequency of a reference clock signal.

12. The device of claim 11, wherein each of the plurality of clock and data recovery blocks includes:
   a phase detector;
   a charge pump;
   a loop filter; and
   a voltage controlled oscillator.

13. The device of claim 11, wherein the frequency detecting block includes:
   a phase-frequency detector;
   a charge pump;
   a loop filter;
   a voltage controlled oscillator; and
   one or more programmable dividers.

14. The device of claim 10, further comprising a thermoelectric cooler coupled to the array of electro-optical transducers, wherein the thermoelectric cooler stabilizes wavelength emission of and absorbs power dissipated by the array of electro-optical transducers.

15. A multi-channel optoelectronic device for use in optical communication networks, comprising:
   a clock and data recovery array for receiving a plurality of data signals from a host, wherein the clock and data recovery array recovers data from the plurality of data signals and provides a plurality of recovered data signals as output, wherein the clock and data recovery array includes a plurality of clock and data recovery blocks for receiving the plurality of data signals, each clock and data recovery block receiving one data signal and recovering a clock and data from the received data signal, and wherein the frequency detecting block acquires and locks to a frequency of a reference clock signal;
   a frequency detecting block coupled with the clock and data recovery array that detects a frequency of the plurality of data signals and is shared throughout the clock and data recovery array;
   a driver array coupled to the clock and data recovery array for receiving the plurality of recovered data signals from the clock and data recovery array and providing plurality of modulation signals as output;
   an electro-optical transducer array coupled to the driver array for receiving the plurality of modulation signals from the driver array and emitting a plurality of optical signals representative of the plurality of recovered data signals; and
   a counter-based frequency comparator, wherein the frequency comparator generates a signal indicating a frequency-locked condition when the frequency detecting block locks to the frequency of the reference clock signal and wherein the generated signal is provided to each of the clock and data recovery blocks.

16. A multi-channel optoelectronic device for use in optical communication networks, comprising:
   a clock and data recovery array for receiving a plurality of data signals from a host, wherein the clock and data recovery array recovers data from the plurality of data signals and provides a plurality of recovered data signals as output;
   a frequency detecting block coupled with the clock and data recovery array that detects a frequency of the plurality of data signals and is shared throughout the clock and data recovery array;
   a driver array coupled to the clock and data recovery array for receiving the plurality of recovered data signals from the clock and data recovery array and providing a plurality of modulation signals as output;
   an electro-optical transducer array coupled to the driver array for receiving the plurality of modulation signals from the driver array and emitting a plurality of optical signals representative of the plurality of recovered data signals;
   an array of opto-electrical transducers for receiving a plurality of receive optical signals from one or more optical fibers and providing a plurality of receive data signals as output;
   an array of amplifiers coupled to the array of opto-electrical transducers for receiving the plurality of receive data signals and providing a plurality of amplified receive data signals as output; and
   a receive clock and data recovery array coupled to the array of amplifiers for receiving the plurality of amplified receive data signals, wherein the receive clock and data recovery array recovers data from the plurality of amplified receive data signals and provides a plurality of recovered receive data signals to the host and wherein frequency detecting functionality is shared throughout the receive clock and data recovery array.

17. The device of claim 16, wherein the receive clock and data recovery array includes:
   a frequency acquisition loop; and
   a plurality of data acquisition loops.

18. The device of claim 16 wherein the receive clock and data recovery array includes:
   a conventional clock and data recovery circuit for receiving a reference clock and recovering a clock signal; and
   a plurality of delay lock loops coupled to the conventional clock and data recovery circuit for receiving the recovered clock and recovering the data from the plurality of amplified receive data signals.

* * * * *